(12) United States Patent
Conradi et al.

(10) Patent No.: US 9,958,795 B2
(45) Date of Patent: May 1, 2018

(54) SPACER DISPLACEMENT DEVICE FOR A WAFER ILLUMINATION UNIT AND WAFER ILLUMINATION UNIT

(71) Applicant: SUSS MicroTec Lithography GmbH, Garching (DE)

(72) Inventors: Matthias Conradi, Munich (DE); Janusz Schulz, Munich (DE)

(73) Assignee: SUSS MicroTec Lithography GmbH (DE)

( * ) Notice: Subject to any disclaimer, the term of this patent is extended or adjusted under 35 U.S.C. 154(b) by 0 days. days.

(21) Appl. No.: 15/182,945

(22) Filed: Jun. 15, 2016

(65) Prior Publication Data
US 2017/0017169 A1    Jan. 19, 2017

(30) Foreign Application Priority Data
Jul. 15, 2015   (NL) .................................. 2015170

(51) Int. Cl.
| | | |
|---|---|---|
| *G03B 27/62* | (2006.01) | |
| *G03F 9/00* | (2006.01) | |
| *H01L 21/67* | (2006.01) | |
| *H01L 21/68* | (2006.01) | |
| *G03F 7/20* | (2006.01) | |

(52) U.S. Cl.
CPC ........ *G03F 9/7003* (2013.01); *G03F 7/70775* (2013.01); *H01L 21/67069* (2013.01); *H01L 21/682* (2013.01)

(58) Field of Classification Search
CPC .............. G03F 7/70775; G03F 9/7003; H01L 21/67069; H01L 21/682
USPC ......................................................... 355/75
See application file for complete search history.

(56) References Cited

U.S. PATENT DOCUMENTS

| | | |
|---|---|---|
| 3,685,117 A | 8/1972 | Wing et al. |
| 5,882,468 A | 3/1999 | Crockett et al. |
| 2007/0210261 A1* | 9/2007 | Kato .................. G01N 23/04 250/453.11 |

\* cited by examiner

*Primary Examiner* — Peter B Kim
(74) *Attorney, Agent, or Firm* — Haynes Soloway PC

(57) ABSTRACT

A spacer displacement device for a wafer illumination unit comprises an actuator, a spacer which can be displaced between an active and an inactive position by the actuator, and a force transmission element which is coupled to the actuator. The force transmission element consists of wire.

24 Claims, 16 Drawing Sheets

SPACER DISPLACEMENT DEVICE FOR A WAFER ILLUMINATION UNIT AND WAFER ILLUMINATION UNIT

The invention relates to a spacer displacement device for a wafer illumination unit, comprising an actuator, a spacer which can be displaced between an active and an inactive position by the actuator, and a force transmission element which is coupled to the actuator. The invention also relates to a wafer illumination unit comprising a spacer displacement device of this type.

BACKGROUND OF THE INVENTION

In a photolithography process, a wafer illumination unit can be used for illuminating a photoresist applied to the wafer. The illumination takes place through a mask, in such a way that in accordance with the shadow of the mask particular regions of the photoresist are not illuminated. As a function of the illumination, physical properties of the photoresist change in such a way that it can be removed in part in a subsequent step, resulting in a (positive or negative) photoresist image of the mask being left on the surface of the wafer.

In subsequent steps, the wafer can subsequently be processed to produce three-dimensional structures. In this way, for example semiconductor chips or MEMSs (microelectromechanical systems) can be produced.

For correct illumination of the photoresist, it is important that the mask is positioned at a precisely defined distance from the wafer. For this purpose, a plurality of the spacers may be used which are displaced from the inactive to the active position by the spacer displacement device when they are required so as to position the mask.

FIGS. 1 and 2 show a known wafer illumination unit 10 along with the spacer displacement devices used therein. A total of three spacer displacement devices 12, 14, 16 are attached to a base body 11 of the wafer illumination unit. These each contain an actuator 18 to which a pivot arm 20 is assigned. In each case a spacer, for example a spacer ball ("proximity ball") or a disc, a roller etc., is attached to the free end of the pivot arm 20, remote from the pivot axis.

To displace the pivot arms 20 from the inactive position shown in FIG. 1 to the active position shown in FIG. 2, each actuator 18 comprises a toothed rod which acts on a gearwheel segment 22 which is attached to each pivot arm 20 concentric with the pivot axis thereof. When the toothed rod is displaced in translation inside the actuator 18, this leads to a pivot movement of the pivot arm 20.

The known construction is relatively complex.

The object of the invention is therefore to provide a spacer displacement device which is of a simpler construction and operates more reliably.

BRIEF DESCRIPTION OF THE INVENTION

To achieve this object, in a spacer displacement device of the aforementioned type, the invention provides that the force transmission element consists of wire. A force transmission element of this type makes it possible to transmit a displacement movement of the actuator directly to the spacer without complicated, complex transmissions being required. As a result of the toothed rod being omitted, there is no longer any risk of the toothed rod jamming as a result of materials used in the photolithography process or in the production of the spacer adjustment unit.

Preferably, the wire is directed wire, in other words wire which has no curvature and extends straight when unloaded. This makes it possible to achieve a high precision.

In one embodiment of the invention, the spacer is attached to a pivot element. This makes it possible to convert a comparatively small stroke of the actuator into a comparatively large adjustment distance of the spacer if said spacer is attached at a correspondingly large distance from the pivot axis of the pivot element.

Preferably, in this case the pivot element is coupled to the wire so as to convert the stroke of the actuator into a pivot movement of the pivot element without intermediate elements.

In this case, the wire may be suspended in an opening of the pivot element in such a way that reliable coupling is achieved with simple assembly.

Preferably, the spacer is attached to a holding arm which is connected to the pivot element. As a result, a modular construction is provided such that different holding arms can be attached to the same pivot element.

In one embodiment of the invention, the holding arm consists of wire. This results in a cost-effective construction.

The spacer may be attached directly to the wire. This also leads to low production costs. In particular, the spacer can be threaded and glued onto the wire. This results in a small action area at the adhesion site for aggressive chemicals used in photolithography processes.

So as to be able to adapt the spacer displacement device to different applications in a simple manner, the holding arm is preferably attached to the pivot element in a height-adjustable manner.

For this purpose, in one embodiment, a plurality of openings in which the holding arm can be arranged may be provided in the pivot element at different heights. The openings ensure reliable guidance of the holding arm in every position.

Alternatively, the pivot element may be provided with an indentation in which the holding arm can be fixed at different heights. As a result, the height of the holding arm can be adjusted (almost) continuously.

So as to be able to fix the holding arm reliably in the pivot element, but be able to release it and mount it again in a different position in a simple manner if required, a fixing screw is preferably provided by means of which the holding arm can be clamped in place in the pivot element.

In a preferred embodiment of the invention, a calibration element comprising a stop face is provided. This makes it possible to calibrate the placement of the spacer in the active position directly.

In this case, it may be provided that the calibration element cooperates with a stop face. This results in simpler assembly and high precision since no interposed components are required.

In an alternative embodiment, a deflection device is provided which is arranged between the actuator and the spacer and acts on the wire. In this embodiment, the stroke of the actor is converted directly into a corresponding stroke of the spacer without interposed coupling elements being required.

In one embodiment of the invention, the deflection device comprises a plurality of deflection rollers. This makes it possible to deflect the wire with little friction.

In an alternative embodiment, the deflection device comprises a guide duct. This variant is distinguished by simpler assembly.

In one embodiment of the invention, the actuator comprises a piston to which the wire is coupled. As a result, a stroke of the piston is converted directly into a stroke of the wire.

The piston may delimit a pressure chamber which can be loaded by a pressurized medium. As a result, the piston can be adjusted in a simple manner by applying for example a vacuum or compressed air to the pressure chamber.

In principle, it is also conceivable for the piston to be adjusted electromagnetically.

Preferably, an adjustment element is provided which delimits the pressure chamber and by means of which the initial position of the piston can be calibrated. As a result, the position of the spacer in the inactive position can be precisely calibrated.

In one embodiment of the invention, a return spring is provided. This ensures that the spacer is automatically returned to the initial position when the actuator is no longer being activated.

The return spring may in particular act on the piston. This results in a compact construction with low friction.

The invention also relates to a wafer illumination unit comprising a spacer displacement device of this type. For the resulting advantages, reference is made to the above explanations.

BRIEF DESCRIPTION OF THE DRAWINGS

In the following, the invention is disclosed by way of two embodiments, which are shown in the accompanying drawings, in which.

DETAILED DESCRIPTION OF THE INVENTION

Figure 1:
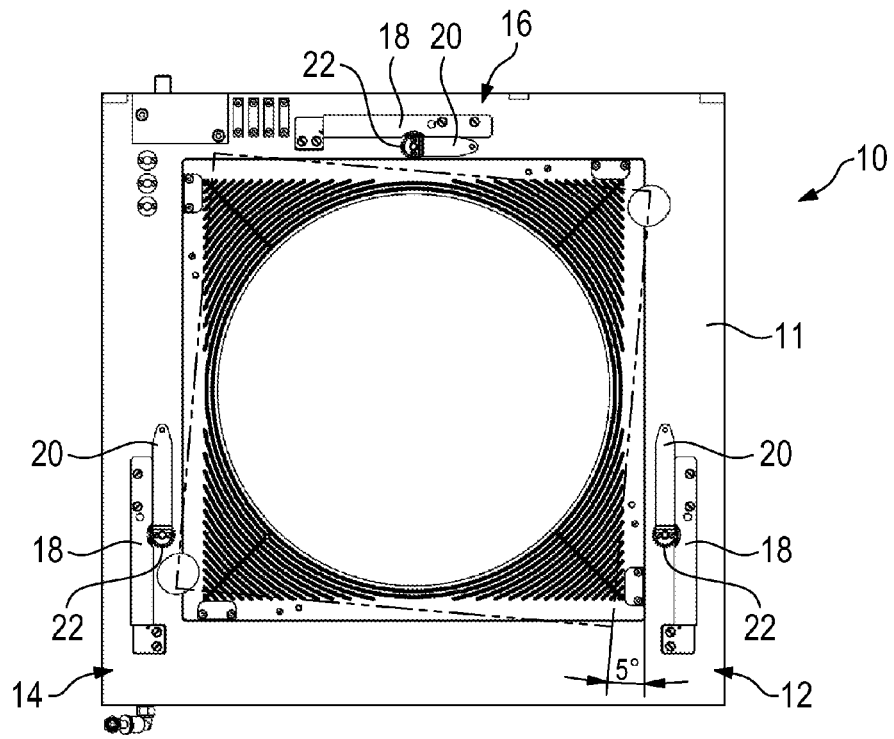
FIG. 1 shows a wafer illumination unit comprising a spacer displacement device in accordance with the prior art, with the spacer being in an inactive position.
Figure 2:
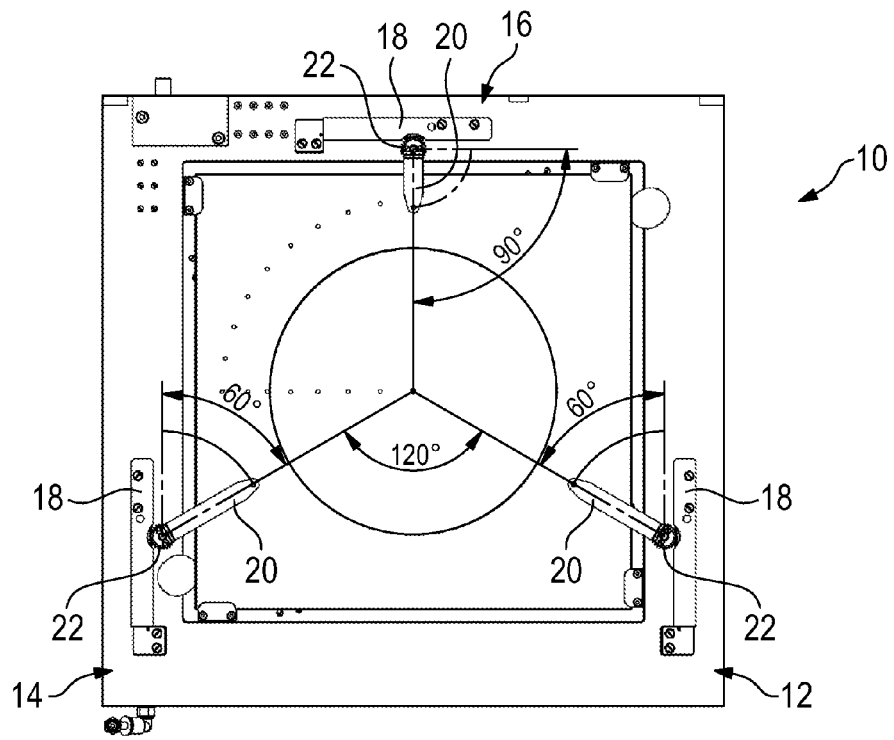
FIG. 2 shows the wafer illumination unit of FIG. 1, with the spacer being in an active position.
Figure 3:
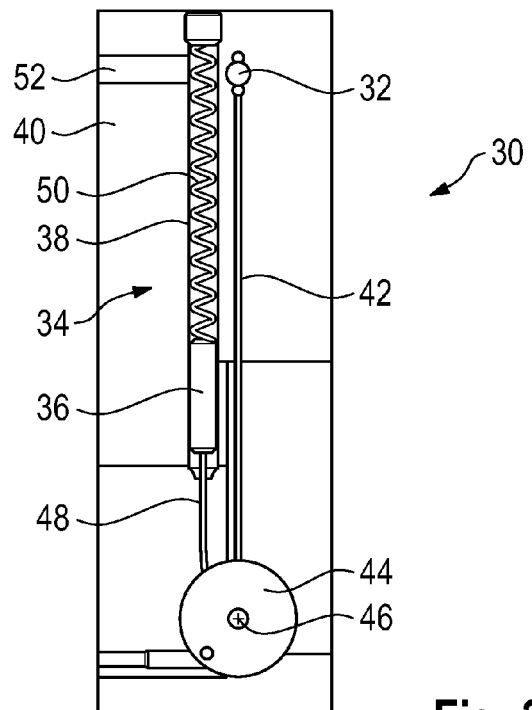
FIG. 3 is a partially sectional view of a spacer displacement device in accordance with a first embodiment of the invention, with the spacer being in an inactive position.
Figure 4:
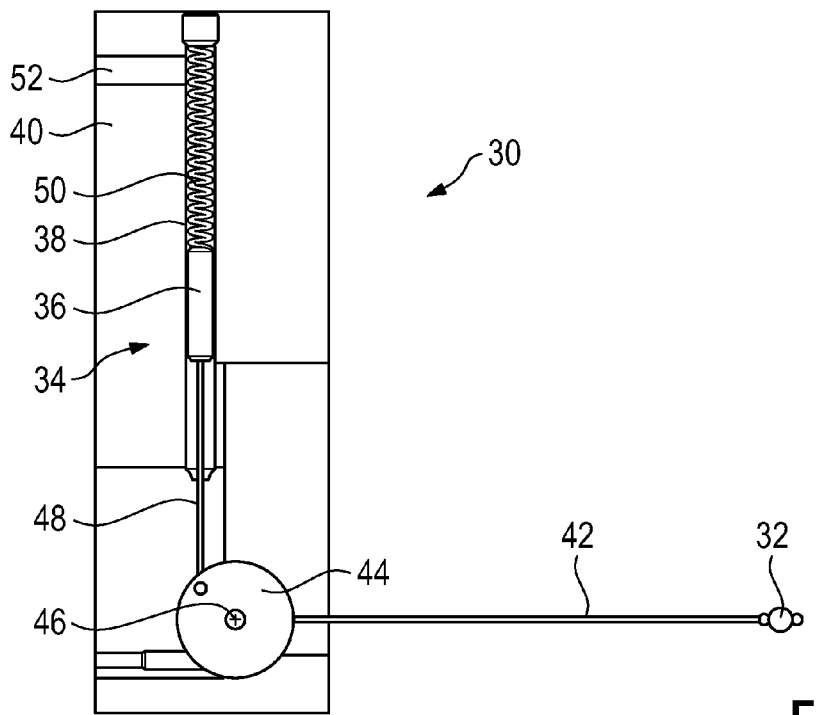
FIG. 4 shows the spacer displacement device of FIG. 3, with the spacer being in an active position.

FIG. 3 shows a spacer displacement device 30 by means of which the spacer 32 can be displaced from an inactivated position, shown in FIG. 3, to an active position, shown in FIG. 4.

In this case, the spacer 32 is a ball which can be used to arrange a mask at a predefined distance relative to a wafer in a wafer illumination unit such as is used in photolithography processes.

The spacer displacement device 30 comprises an actuator 34 by means of which the spacer 32 can be displaced.

In the embodiment shown in FIGS. 3 and 4, the actuator 34 contains a piston 36 which is arranged adjustable in a cylinder 38. The cylinder 38 is provided in a base body 40 of the actuator 34.

The spacer 32 is attached to a holding arm 42 which in turn is attached to a pivot element 44. The pivot element 44 is arranged pivotably about an axis 46 in the base body 40.

In this case, the holding arm 42 is configured as a long, straight rod which may for example consist of metal, in particular of wire. It is connected to the pivot element 44 in such a way that it is adjusted when the pivot element 44 is rotated. The holding arm 42 may for example be clipped into a recess in the pivot element 44.

The pivot element 44 is connected to the piston 36 by means of a force transmission element 48 which consists of wire. In the embodiment shown, directed wire is used, which extends in a straight line.

The force transmission element 48 is pivotably connected to the pivot element 44. In the embodiment shown, an angled end portion of the force transmission element 48 is suspended in an opening of the pivot element 44. The connection is thus similar to the connection between a bicycle spoke and a hub, in which an elbowed end of the spoke is accommodated in an opening in the hub.

The end of the force transmission element 48 remote from the pivot element 44 is connected to the piston 36 in a tension-proof and compression-proof manner. The piston 36 may for example have a central opening into which the force transmission element 48 is inserted.

In the cylinder 38, a return spring 50 which loads the piston 36 into the initial position shown in FIG. 3 in which the spacer 32 is in the inactive position, is arranged on the side of the piston 36 remote from the pivot element.

The cylinder is connected to a pressure medium terminal 52 such that a pressure chamber which is formed in the cylinder 38 and which is sealed at one end by the piston 36 can be exposed to a pressure in a controlled manner.

To displace the spacer 32 from the inactive position shown in FIG. 3 into the active position shown in FIG. 4, the pressure chamber in the cylinder is connected to a vacuum via the pressure medium terminal 52. As a result, the piston 36 is displaced upwards counter to the action of the return spring 50 with respect to FIGS. 3 and 4. This stroke is transmitted via the force transmission element 48 to the pivot element 44 which accordingly (together with the spacer 32) carries out a pivot movement clockwise.

To return the spacer 32 to the inactive position again, the pressure chamber inside the cylinder 38 is ventilated via the pressure medium terminal 52. This has the result that the piston 36 comes back into the initial position under the action of the return spring 50 and the pivot element 44 thus pivots anti-clockwise.

By means of the force transmission element 48, the stroke of the piston 36 is transmitted directly and virtually without friction to the pivot element 44. The slight lateral deflection undergone by the connection point between the pivot element 44 and the force transmission element 48 when the pivot element 44 is adjusted between the inactive and the active position can be received by the force transmission element as a result of the inherent resilience thereof, without the piston being loaded with a disruptive tilting moment.

FIGS. 5 to 10 show a variant on the first embodiment of the spacer displacement device. The same reference numerals are being used for the components known from the first embodiment, and reference is being made to the above descriptions in this regard.

The major difference between the first embodiment and the variant configuration of FIGS. 5 to 10 is that in the variant configuration the piston is displaced using pressurised air (or alternatively a gas under pressure) rather than using a vacuum.

Figure 5:
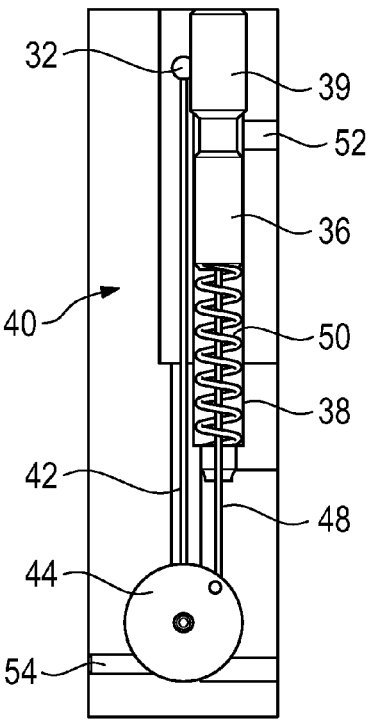
FIG. 5 is a partially sectional plan view of a spacer displacement device in accordance with a variant on the first embodiment, with the spacer being in an inactive position.
Figure 6:
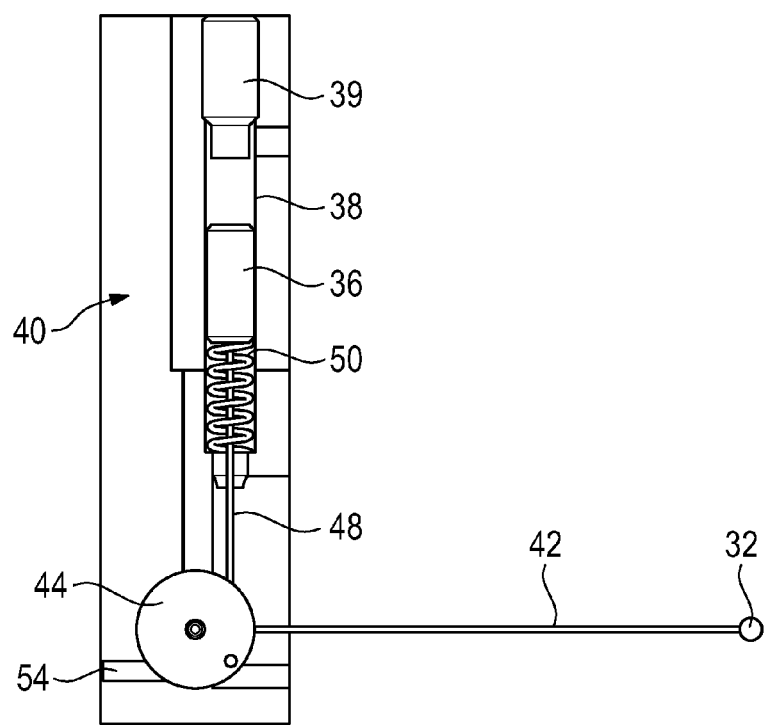
FIG. 6 shows the spacer displacement device of FIG. 5 with the spacer in an active position.
Figure 7:
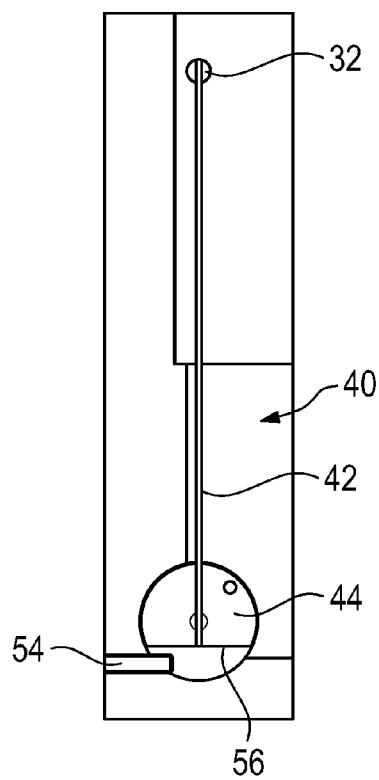
FIG. 7 shows the spacer displacement device of FIG. 5 in a different sectional plane.

As can be seen in FIGS. 5 and 6, the piston 36 and a locking element 39 are arranged in the cylinder 38. The return spring 50 is arranged on the side of the piston 36 facing the pressure terminal 52, in other words between the piston 36 and the pivot element 44.

When pressurised air is supplied to the pressure terminal 52, the piston is transferred from the initial position shown in FIG. 5 to the activated position shown in FIG. 6, in such a way that the spacer 32 is transferred from the inactive position to the active position.

The placement of the spacer 32 in the inactive position can be calibrated in that the locking element engages in the cylinder to a greater or lesser extent. For this purpose, the locking element 39 may be provided with an external thread which engages in an internal thread in the cylinder 38 in the base body 40.

The placement of the spacer 32 in the active position can be calibrated using a calibration element 54 (see FIGS. 7 and 8) which can cooperate with the pivot element 44.

Figure 8:
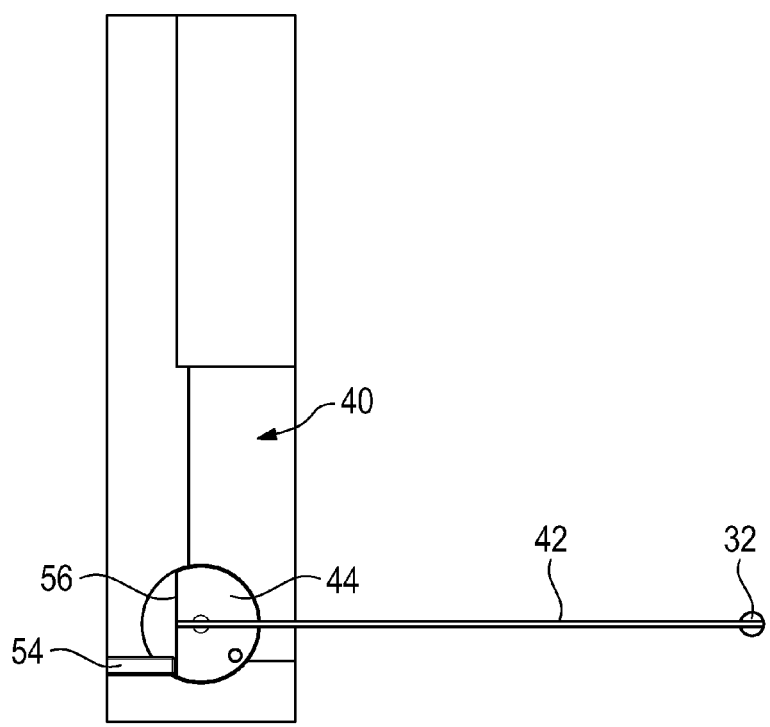
FIG. 8 shows the spacer displacement device of FIG. 6 in the sectional plane of FIG. 7.

In the embodiment shown, a stop face 56 is provided on the pivot element 44, and strikes against the calibration element 54 when the spacer 32 and thus the pivot element 44 are in the active position (see FIG. 8).

In a manner similar to the locking element 39, the calibration element 54 can be provided with an external thread which engages in an internal thread in the base body 40.

Figure 9:
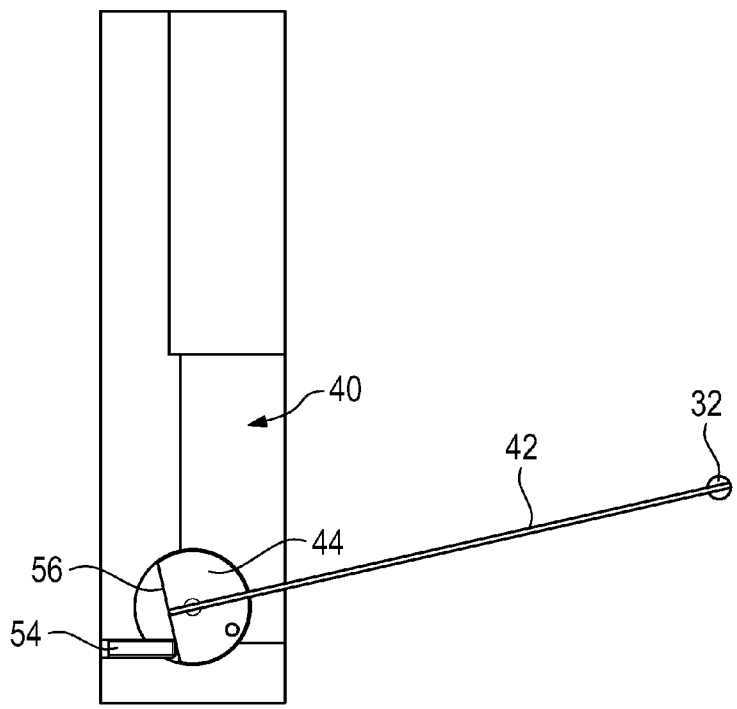
FIG. 9 shows the spacer displacement device of FIGS. 7 and 8 in a different calibration state.

As can be seen in FIG. 9, by means of the calibration element 54 not only can it be ensured that the spacer 32 is displaced through exactly 90° between the inactive and the active position, but other pivot angles can also be set. In this case, the calibration element 54 is screwed further into the base body 40 such that the pivot angle of the spacer 32 is smaller than in the variant shown in FIGS. 7 and 8.

Figure 10:
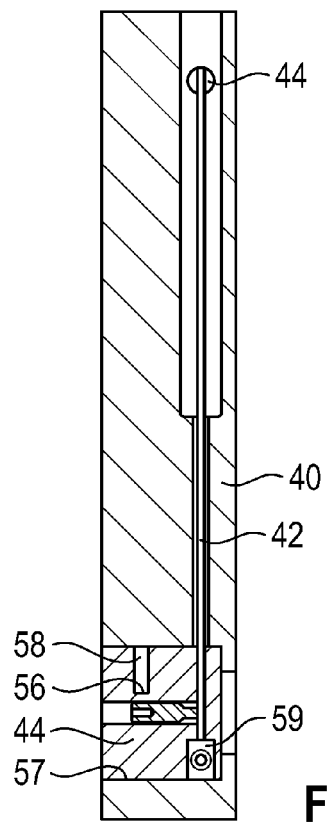
FIG. 10 is a sectional side view of the spacer displacement device of FIGS. 5 to 9.

In FIG. 10, it can be seen that the pivot element 44 is formed cylindrical and the peripheral face thereof is inserted into a cylinder recess 57 in the base body 40. The stop face 56 is formed as the floor of a groove 58 which extends into the pivot element by a particular depth. The holding arm 42 is clipped into a recess 59 provided on the pivot element 44.

Figure 11:
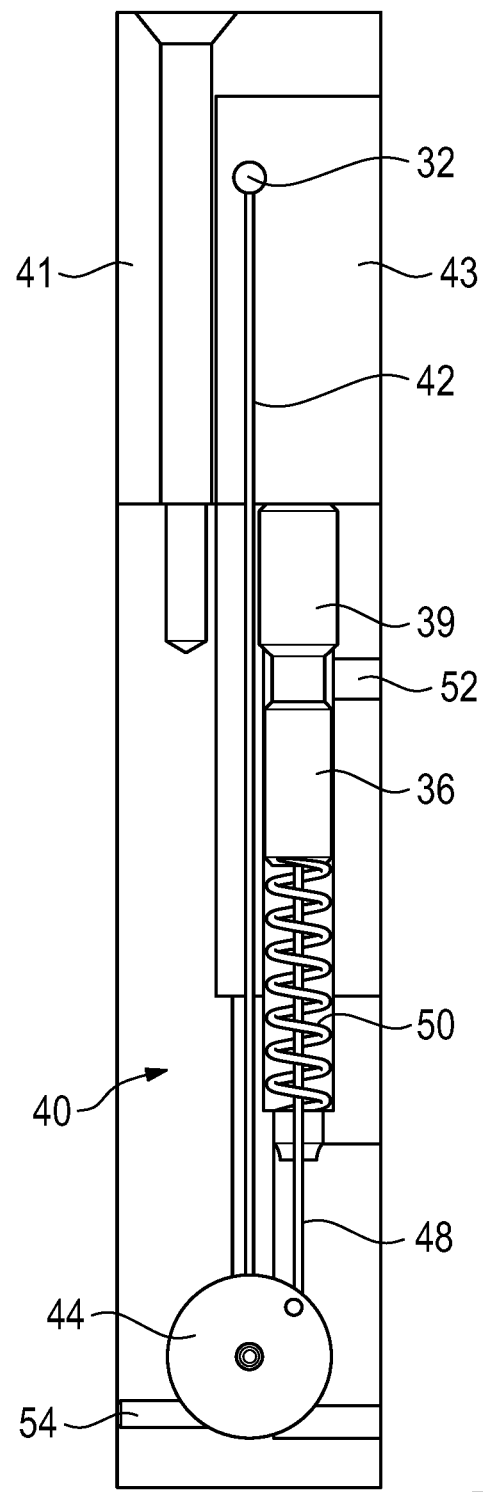
FIG. 11 is a variant on the spacer displacement device shown in FIG. 5, with the spacer being in an inactive position.

FIG. 11 shows a further variant of the spacer displacement device. The difference from the variant shown in FIGS. 5 to 10 is that a cover element 41 provided with a recess 43 is placed on the base body 40.

The cover element 41 forms an extension of the base body 40 such that the spacer, when it is attached to a very long holding arm, is "parked" in the cover element rather than projecting freely out of the spacer displacement device 30 and being unprotected. In this case, it and the spacer 32 are very well protected against mechanical loads and any soiling.

The cover element 41 is releasably fixed to the base body 40 by means of a screw 45. In this way, the adjustment device can be modularly adapted to construction circumstances.

In view of the different configurations and fields of application, it is desirable to arrange the holding arm 42 and thus the spacer 32 adjustably at different heights. The pivot element 44 can be used for this purpose in a simple manner.

Figure 12:
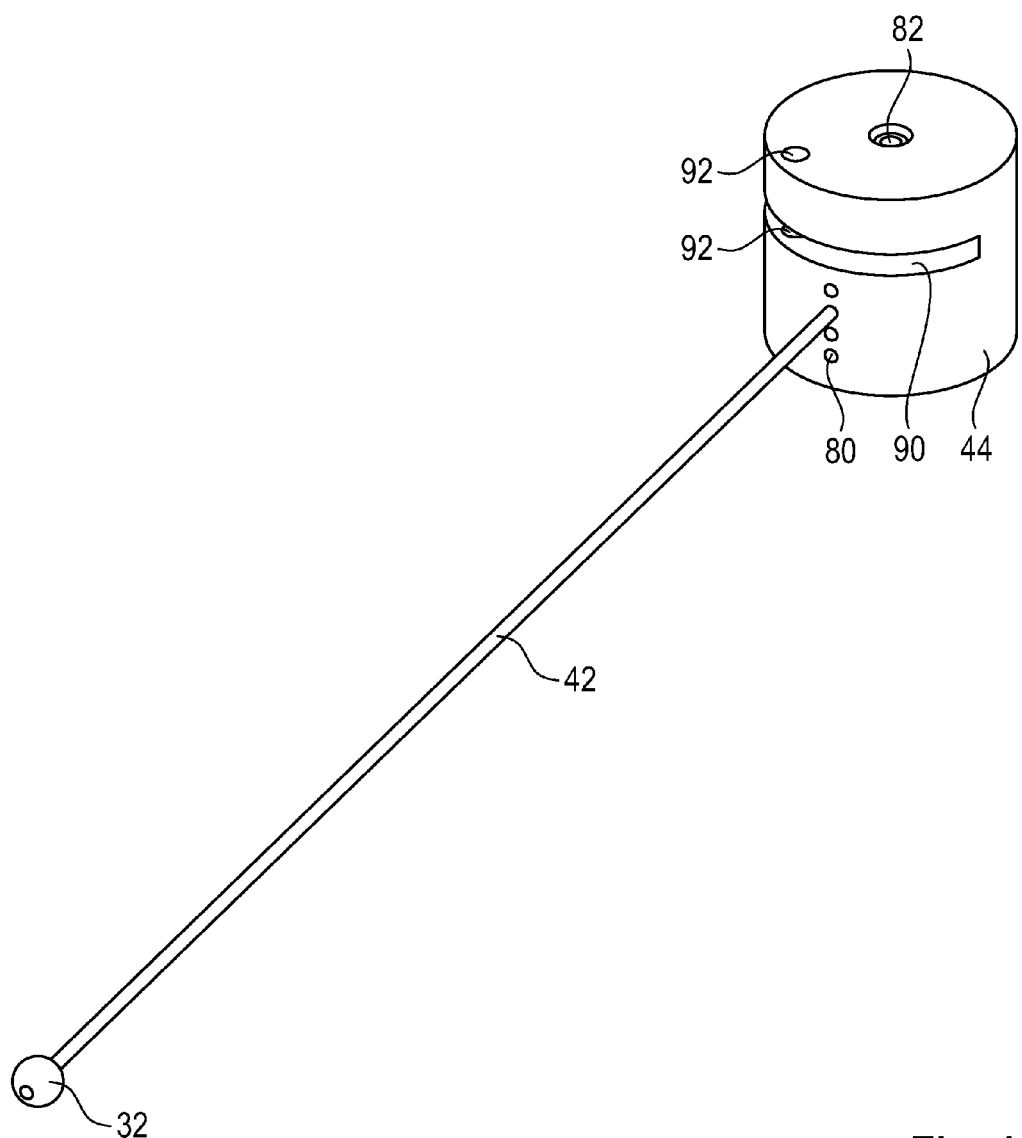
FIG. 12 is a perspective view of an adjustment element for a spacer displacement device in accordance with FIGS. 5 to 11 comprising a holding arm for the spacer, which is in a central position.
Figure 13:
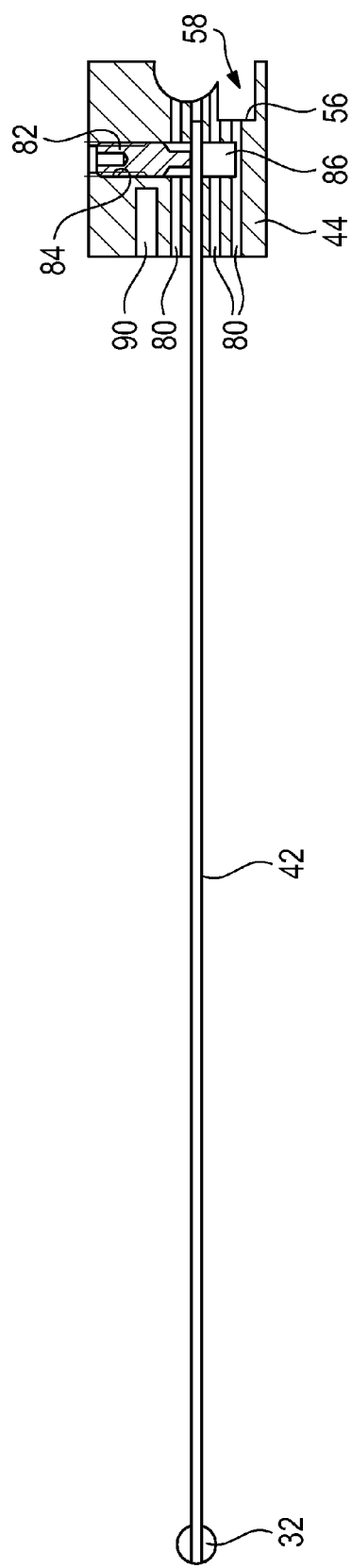
FIG. 13 is a section of the adjustment element of FIG. 12.

FIGS. 12 and 13 show a configuration of the pivot element 44 which is suitable for adjusting the height of the holding arm 42. The pivot element 44 is provided with a plurality of openings 80 which extends inwards from the cylindrical outer surface of the pivot element 44.

In the embodiment shown, the openings 80 extend in the radial direction. However, it is also possible for the openings 80 to extend obliquely to a radial orientation.

In total, four openings 80 are being used in this case, which are all arranged above one another. As a result, it is possible to arrange the holding arm 42 (and thus the spacer 32) at a respectively desired height (cf. FIGS. 12 and 13 on the one hand in which the holding arm 42 is arranged in one of two central positions, with FIGS. 14 and 15 on the other hand in which the holding arm is in a lower position).

To fix the holding arm 42 in the respectively selected opening 80, a fixing screw 82 may be used, which is screwed into the clamping hole 84 to such an extent that the holding arm is reliably fixed in place. If desired, in cases where the holding arm 42 is not in the lowest position, a spacer 86 (see FIG. 13) may be placed underneath.

Figure 14:
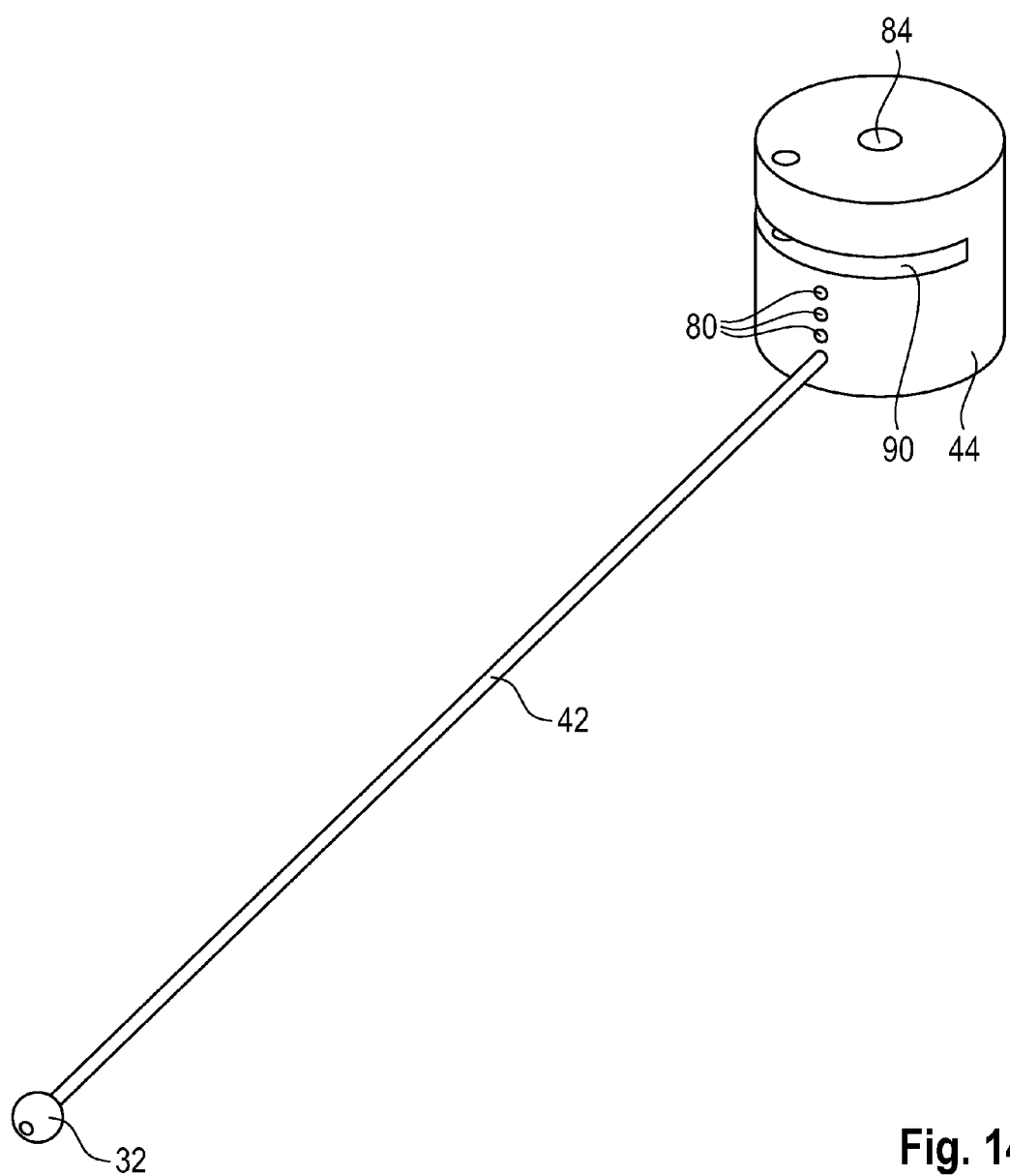
FIG. 14 is a perspective view of the adjustment element of FIG. 12, the holding arm being in a lower position.
Figure 15:
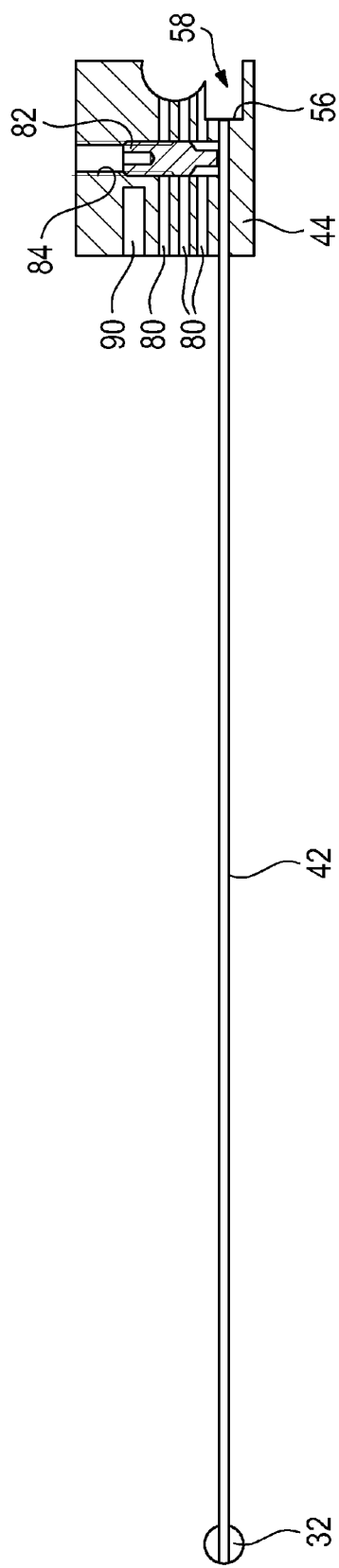
FIG. 15 is a section of the adjustment element of FIG. 14.

In FIGS. 12 and 14, an indentation 90 can also be seen, in which two passages 92 open. This is where the force transmission element 48 is coupled to the pivot element 44, for example by clipping a ball head of the force transmission element into the depressions provided at the intersection point of the passages 92 with the indentation 90.

Figure 16:
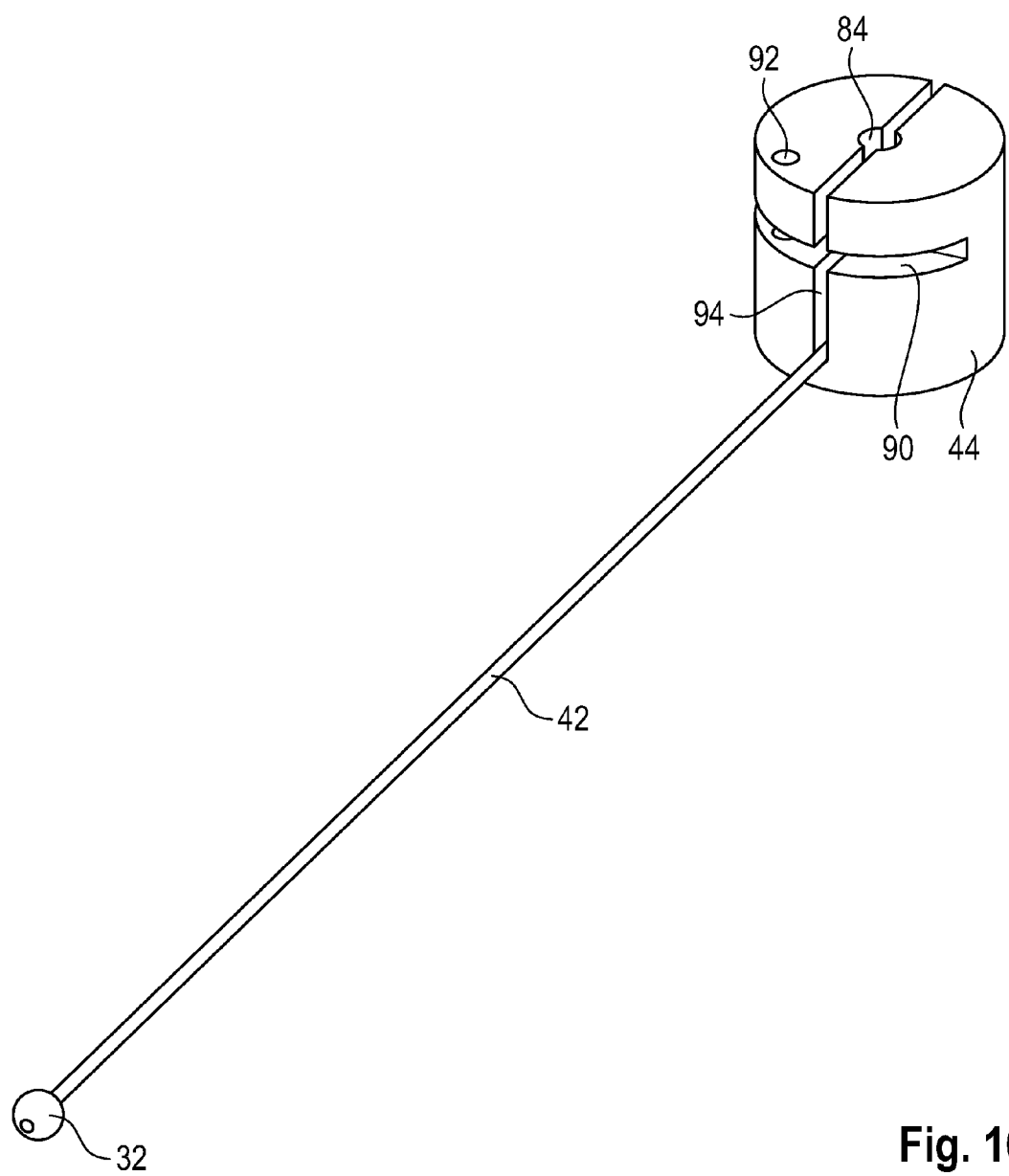
FIG. 16 is a perspective view of an adjustment element of an alternative variant configuration, the holding arm being attached in a lower position.
Figure 17:
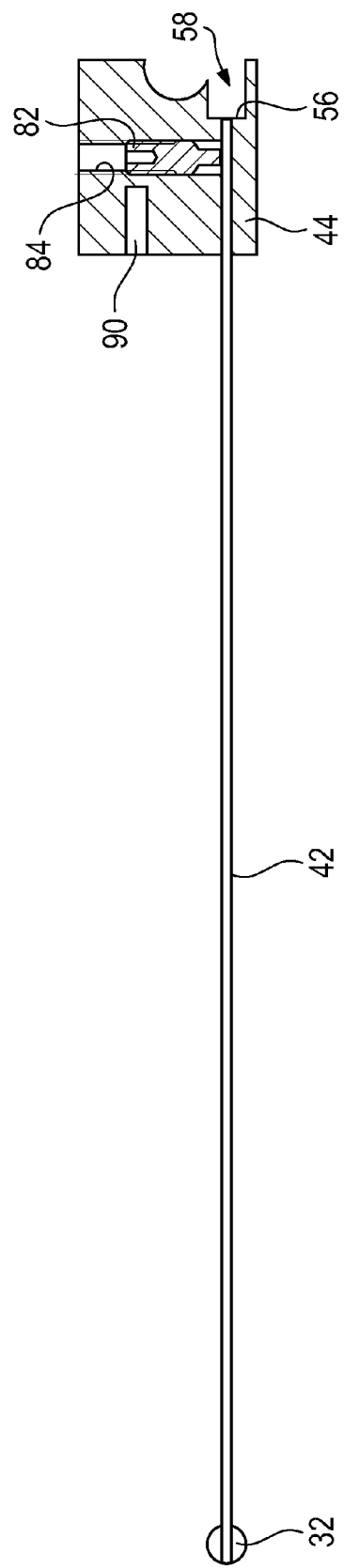
FIG. 17 is a section of the adjustment element of FIG. 16.

FIGS. 16 and 17 show a variant of the pivot element 44 in which the height of the holding arm can be adjusted (virtually) continuously, rather than in steps as is the case in the embodiment of FIGS. 12 to 15.

For this purpose, a receiving duct 94 is provided in the pivot element and extends through the pivot element in the same orientation as the entirety of the openings 80. In the embodiment shown, the receiving duct is configured as an indentation which extends through the pivot element diametrically from the upper face and ends just above the base face of the pivot element.

The holding arm 42 is inserted into the receiving duct 94 where it is fixed by means of a fixing screw 82. This engages in a thread provided in a clamping hole 84 which intersects the receiving duct 94.

When the holding arm 42 is fixed in the lowest position thereof, the fixing screw 82 clamps the holding arm against the base of the receiving duct 94 (see FIGS. 16 and 17).

Figure 18:
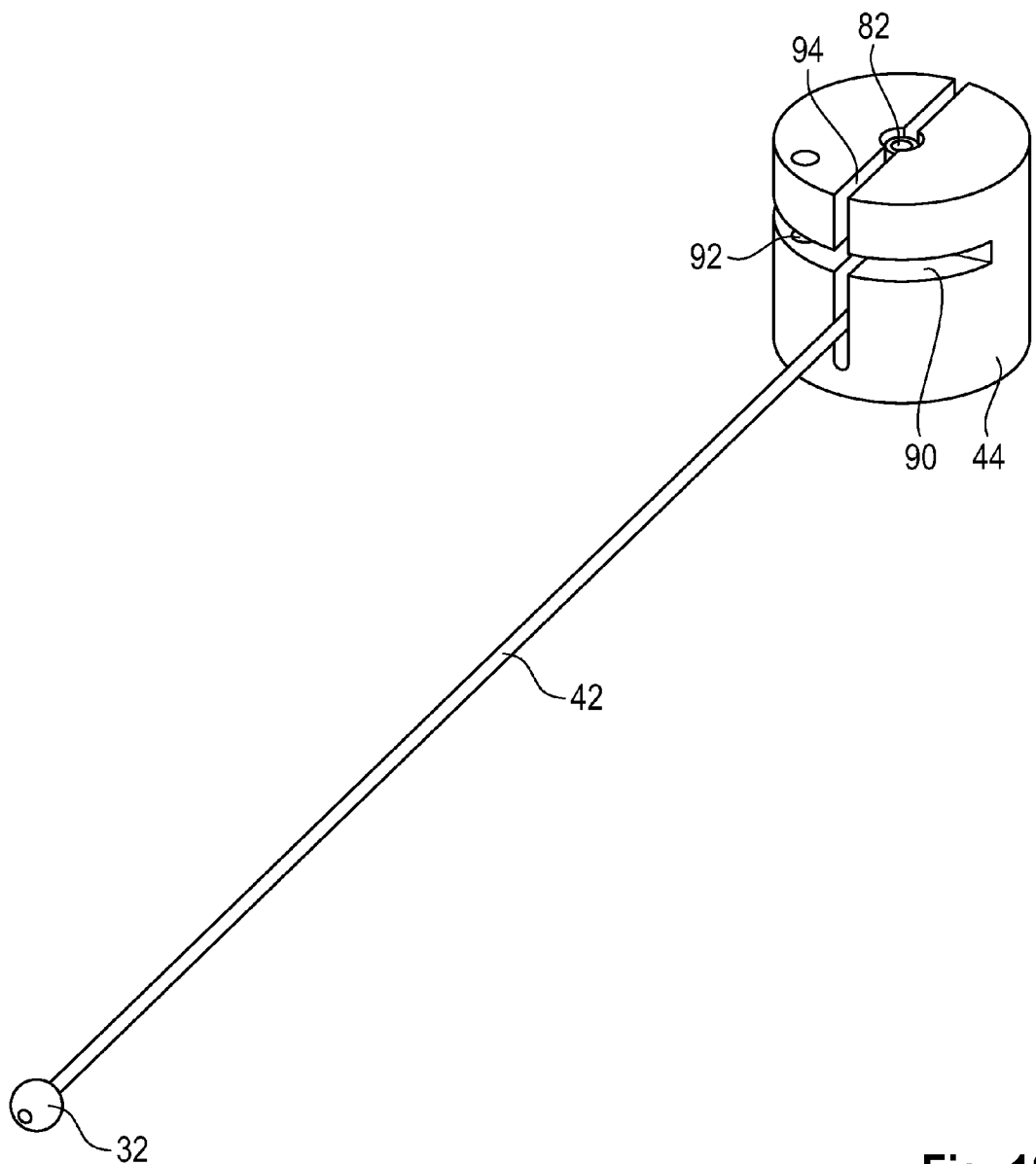
FIG. 18 is a perspective view of the adjustment element of FIG. 16, with the holding arm being in a central position.
Figure 19:
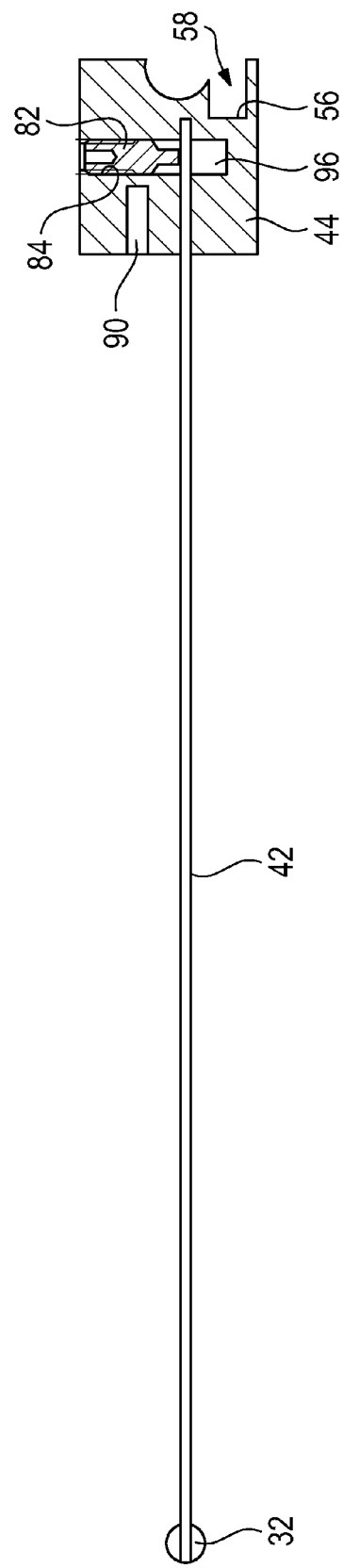
FIG. 19 is a section of the adjustment element of FIG. 18.

When the holding arm is to be fixed in a higher position (see FIGS. 18 and 19), a height adjustment part 96 which is braced against the base of the clamping duct and against which the holding arm 42 subsequently comes to be positioned, is laid in the clamping duct and/or the clamping hole. The fixing screw 82 thus clamps the holding arm against the upper face of the height adjustment part.

Figure 20:
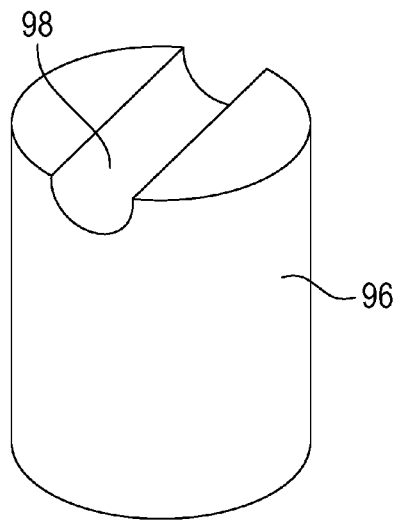
FIG. 20 is a perspective, greatly enlarged view of a height adjustment part used in the configuration of FIGS. 18 and 19.

FIG. 20 shows a configuration of a height adjustment part 96. This is a cylinder, the outer diameter of which approximately corresponds to the internal diameter of the clamping hole 84. On the upper face thereof, the height adjustment part is provided with a semi-cylindrical recess 98 such that the holding arm is received there in a planar manner.

The height adjustment part 96 can be held up at a number of different heights, in such a way that the holding arm can be mounted at the respectively desired height in very fine steps.

Figure 21:
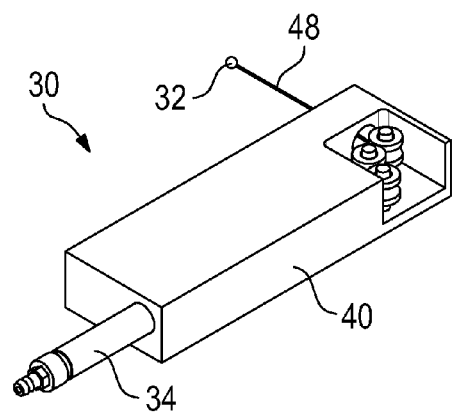
FIG. 21 is a perspective view of a spacer displacement device in accordance with a second embodiment of the invention.
Figure 22:
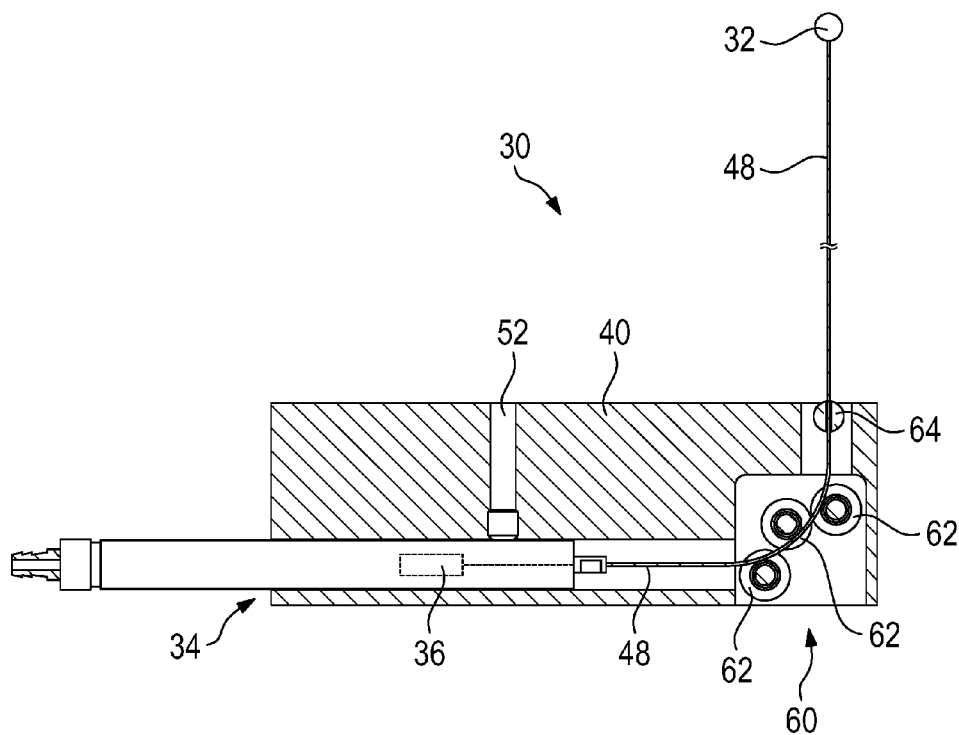
FIG. 22 is a sectional view of the spacer displacement device of FIG. 21.

FIGS. 21 and 22 show a second embodiment. The same reference numerals are being used for the components known from the first embodiment, and reference is being made to the above descriptions in this regard.

The difference between the first and the second embodiment is that in the second embodiment the spacer 32 is displaced in translation instead of in rotation.

In the second embodiment, the spacer 32 is attached to the force transmission element 48. In this case too, the force transmission element 48 is formed by a directed wire. This is guided from the piston 36 of the actuator 34 via a deflection device 60. The deflection device 60 makes it possible to displace the spacer 32 between the inactive and the active position in a direction deviating from the direction of the stroke of the piston 36. This can be expedient in view of limitations on the available construction space.

In the embodiment shown, the deflection device 60 consists of a plurality of deflection rollers 62 which deflect the force transmission device 48 through 90°. The deflection rollers 62 are arranged in such a way that the force transmission element 48 is guided at a sufficiently high radius of curvature that no plastic deformation is brought about.

Between the deflection device 60 and the spacer 32, a further wire guide 64 is provided, which additionally stabilises the force transmission element 48 at the output of the spacer displacement device 30.

Instead of deflection rollers 62, a wire guide similar to a Bowden cable may also be used so as to guide and deflect the wire in the desired manner. If a counter bearing of the Bowden casing is adjustable, the position of the spacer 32 can be calibrated in the adjustment direction in a simple manner.

Figure 23:
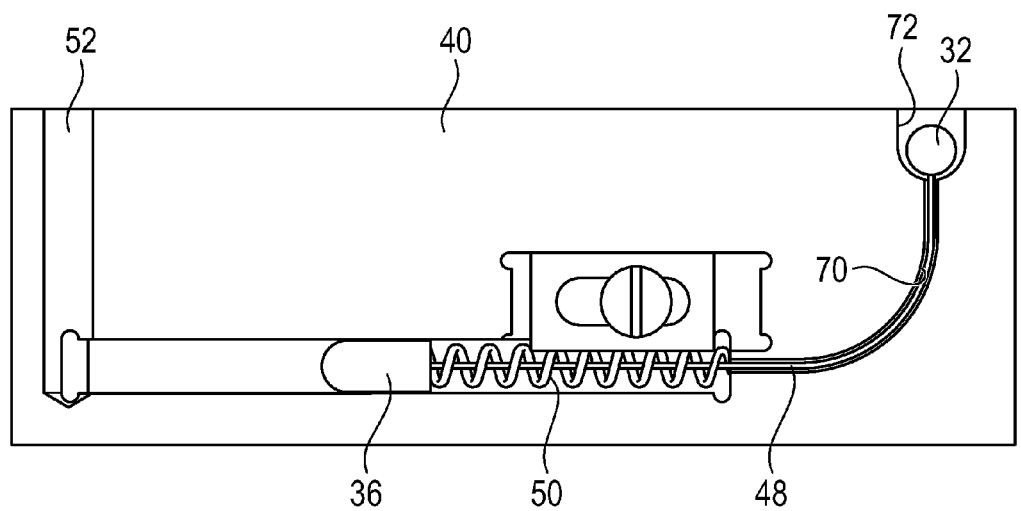
FIG. 23 is a spacer displacement device in accordance with a variant on the second embodiment.

FIG. 23 shows a variant on the second embodiment. The same reference numerals are being used for the components known from the second embodiment, and reference is being made to the above descriptions in this regard.

The major difference between the variant shown in FIG. 23 and the embodiment of FIGS. 21 and 22 is that in FIG. 23 the deflection device 60 does not have any deflection rollers but is instead formed by a curved duct 70 which is provided in the base body 40.

As a result, the force transmission element 48 is deflected out of the displacement direction of the piston 36 into the desired displacement direction for the spacer 32.

A further difference is that in the spacer displacement device of FIG. 23 the force transmission element is configured sufficiently short that the spacer 32 is "parked" in a recess 72 in the base body 40 in the inactive position. This is also possible in principle in the embodiment shown in FIGS. 21 and 22 if the force transmission element 48 is made correspondingly shorter and the wire guide 64 is omitted.

The invention claimed is:

1. A spacer displacement device for a wafer illumination unit, comprising an actuator, a spacer which can be displaced from an active position to an inactive position and from the inactive position to the active position by said actuator, and a force transmission element which is coupled to said actuator, said force transmission element consisting of directed wire.

2. The spacer displacement device of claim 1 wherein said spacer is attached to a pivot element.

3. The spacer displacement device of claim 2 wherein said pivot element is coupled to said wire.

4. The spacer displacement device of claim 2 wherein said spacer is attached to a holding arm which in turn is connected to said pivot element.

5. The spacer displacement device of claim 4 wherein said holding arm consists of wire.

6. The spacer displacement device of claim 5 wherein said spacer is attached to said wire.

7. The spacer displacement device of claim 4 wherein said holding arm is adapted for being be attached to said pivot element in a height-adjustable manner.

8. The spacer displacement device of claim 7 wherein said pivot element is provided with a plurality of openings in which said holding arm can be arranged at different heights.

9. The spacer displacement device of claim 8 wherein a fixing screw is provided by means of which said holding arm can be clamped in place in said pivot element.

10. The spacer displacement device of claim 7 wherein said pivot element is provided with an indentation in which said holding arm can be fixed at different heights.

11. The spacer displacement device of claim 2 wherein a calibration element is provided which cooperates with said pivot element.

12. The spacer displacement device of claim 11 wherein said calibration element can cooperate with a stop face.

13. The spacer displacement device of claim 1 wherein said wire is suspended in an opening of said pivot element.

14. The spacer displacement device of claim 1 wherein a deflection device is provided which is arranged between said actuator and said spacer and acts on said wire.

15. The spacer displacement device of claim 14 wherein said deflection device comprises a plurality of deflection rollers.

16. The spacer displacement device of claim 14 wherein said deflection device comprises a wire guidance casing.

17. The spacer displacement device of claim 14 wherein said deflection device comprises a guide duct.

18. The spacer displacement device of claim 1 wherein said actuator comprises a piston to which said wire is coupled.

19. The spacer displacement device of claim 18 wherein said piston delimits a pressure chamber which can be loaded by a pressurized medium.

20. The spacer displacement device of claim 18 wherein an adjustment element is provided which delimits said pressure chamber and by means of which an initial position of said piston can be calibrated.

21. The spacer displacement device of claim 18 wherein a return spring is provided.

22. The spacer displacement device of claim 21 wherein said return spring acts on said piston.

23. A wafer illumination unit comprising a spacer displacement device, said spacer displacement device comprising a spacer which can be displaced between an active and an inactive position by said actuator, and a force transmission element which is coupled to said actuator, said force transmission element consisting of directed wire.

24. The wafer illumination unit of claim 23, wherein the wire is directly connected to the spacer.

\* \* \* \* \*